United States Patent
Andreev et al.

(10) Patent No.: US 7,818,703 B2
(45) Date of Patent: *Oct. 19, 2010

(54) DENSITY DRIVEN LAYOUT FOR RRAM CONFIGURATION MODULE

(75) Inventors: Alexander Andreev, San Jose, CA (US); Ivan Pavisic, San Jose, CA (US); Anatoli Bolotov, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 430 days.

This patent is subject to a terminal disclaimer.

(21) Appl. No.: 11/757,200

(22) Filed: Jun. 1, 2007

(65) Prior Publication Data

US 2008/0016482 A1 Jan. 17, 2008

Related U.S. Application Data

(62) Division of application No. 11/007,039, filed on Dec. 8, 2004, now Pat. No. 7,246,337.

(51) Int. Cl.
*G06F 17/50* (2006.01)

(52) U.S. Cl. .......................................... 716/10; 716/11

(58) Field of Classification Search ................ 716/8–12
See application file for complete search history.

(56) References Cited

U.S. PATENT DOCUMENTS

| | | | |
|---|---|---|---|
| 6,088,519 A | 7/2000 | Koford | 716/9 |
| 6,292,929 B2 | 9/2001 | Scepanovic et al. | 716/14 |
| 6,446,248 B1 | 9/2002 | Solomon et al. | 716/17 |
| 6,492,736 B1 | 12/2002 | Chan et al. | 257/773 |
| 6,564,364 B1 | 5/2003 | Dahl et al. | 716/11 |
| 6,665,850 B1 | 12/2003 | Andreev et al. | 716/7 |
| 6,691,283 B1 | 2/2004 | Gashkov et al. | 716/1 |
| 6,691,290 B1 * | 2/2004 | Wu | 716/4 |
| 6,757,881 B2 | 6/2004 | Andreev et al. | 716/12 |
| 6,760,896 B2 | 7/2004 | Andreev et al. | 716/10 |
| 6,766,500 B1 | 7/2004 | Donelly et al. | 716/10 |
| 6,766,501 B1 | 7/2004 | Duggirala et al. | 716/11 |
| 6,938,226 B2 | 8/2005 | Nguyen et al. | 716/1 |
| 7,028,285 B2 * | 4/2006 | Cote et al. | 716/21 |
| 2003/0231211 A1 | 12/2003 | Shah et al. | 345/771 |
| 2004/0114429 A1 | 6/2004 | Ehiro et al. | 365/158 |

OTHER PUBLICATIONS

Wey, C.L. and Lombardi, F.; "On the Repair of Redundant RAM's," *IEEE Transactions on Computer-Aided Design*, vol. CAD-6, No. 2, Mar. 1987, pp. 222-231.

(Continued)

*Primary Examiner*—Jack Chiang
*Assistant Examiner*—Binh C Tat
(74) *Attorney, Agent, or Firm*—David D. Brush; Westman, Champlin & Kelly, P.A.

(57) ABSTRACT

A system for layout of a module in an integrated circuit layout pattern has a cell library and a cell placement system. The cell library includes a plurality of cells. The cell placement system is adapted to select one or more cells from the cell library and to locally place each selected cell within the module layout so that each cell pin of the selected cells and each port of the module layout occupies a unique vertical routing track within the module layout.

14 Claims, 6 Drawing Sheets

OTHER PUBLICATIONS

W.W. Zhuang et al.; "Novell Colossal Magnetoresistive Thin Film Nonvolatile Resistance Random Access Memory (RRAM)," *IEEE Transactions* 2002, pp. 193-196.

Yi-Chou Chen et al.; "An Access-Transistor-Free (0T/1R) Non-Volatile Resistance Random Access Memory (RRAM) Using a Novel Threshold Switching, Self-Rectifying Chalcogenide Device," *IEEE Transactions* 2003, pp. 905-908.

Battaglini, G. and Ciciani, B.; "An Improved Analytical Yield Evaluation Method for Redundant RAM's," Dept. fo Systems and Computer Engineering, University of Rome, Italy, pp. 1-7.

K. Ganapathy et al.; "Yield Modeling & Optimization of Large Redundant RAM's," *IEEE Transactions*, International Conference on Wafer Scale Integration 1990, pp. 273-287.

R. Haddad et al.; "Increased Throughput for the Testing and Repair of RAM's with Redundancy," *IEEE Transactions on Computers*, vol. 40, No. 2, Feb. 1991, pp. 154-166.

Libeskind-Hadas, R. & Liu, C.L.; "Fast Search Algorithms for Reconfiguration Problems," *IEEE Transactions*, 1991 International Workshop on Defect and Fault Tolerance on VLSI Systems, pp. 260-273.

Leong, H.W. & Low, C.P.; "New Results on Fault Covering in RRAMs," *IEEE Transactions*, pp. 2148-2151.

Low, C.P. and Leong, H.W.; "A New Class of Efficient Algorithms for Reconfiguration of Memory Array," *IEEE Transactions on Computers*, vol. 45, No. 5, May 1996, pp. 614-618.

* cited by examiner ated circuit.

DENSITY DRIVEN LAYOUT FOR RRAM CONFIGURATION MODULE

CROSS-REFERENCE TO RELATED APPLICATION

The present application is a divisional of and claims priority from U.S. patent application Ser. No. 11/007,039, filed Dec. 8, 2004, the content of which is hereby incorporated by reference in its entirety.

FIELD OF THE INVENTION

The present invention relates to cell placement in integrated circuit layouts, and more particularly, to algorithms and procedures for complete layout of a given module in integrated circuit.

BACKGROUND OF THE INVENTION

An integrated circuit chip (hereinafter referred to as an "IC" or "chip") includes cells and inter-cell connections supported by a substrate. A cell is a group of one or more circuit elements, such as transistors, capacitors, resistors, and other basic circuit elements grouped to perform functions, both arithmetic and logical.

On an IC, each cell may include one or more pins, which in turn may be connected to one or more pins of other cells by wires or wire traces. A net comprises circuitry coupling two or more pins. A typical IC includes a large number of cells and requires complex wire interconnections between the cells. A typical chip has thousands, tens of thousands or even hundreds of thousands of pins, which are connected in various combinations.

Signal buses are formed on the IC to carry data and control signals between various circuit elements. Signal buses may be composed a plurality of wires. Metal layers, separated by layers of insulator material, are configured to define circuit routing wires for connecting various elements of the IC. Usually, certain metal layers are dedicated to horizontal routing wires and other metal layers are dedicated to vertical routing wires. For example, horizontal routing wires may be formed on even numbered metal layers, while odd numbered metal layers are dedicated to vertical routing wires. Metal posts or channels called "vias" between horizontal and vertical routing wires provide connections between them so that signals and power can propagate through the IC.

In general, cells are organized into functional modules, which are then placed within a layout pattern for the IC. Each module has a fixed width and a variable height and contains input and output pins. Each pin is assigned to one of two opposite sides of the module and is arranged at a given coordinate within the layout pattern, such as a horizontal coordinate (x) and/or vertical coordinate (y) on an x-y axis. Output pins are assigned to one or more input pins of other cells in the layout pattern, and both input and output pins are electrically connected to pins of other cells in the layout pattern through one or more conductive segments that define a "net" or "wire".

One continuing problem associated with IC design is to place cells within a module in an optimal arrangement and to allow for efficient routing through the module. This is particularly true for high density modules such as Redundant Random Access Memory (RRAM) configuration modules.

There is an ongoing need in the IC design art for systems and algorithms for optimizing cell placement in density-driven layouts.

SUMMARY OF THE INVENTION

A system for layout of a module in an integrated circuit layout pattern has a cell library and a cell placement system. The cell library includes a plurality of cells. The cell placement system is adapted to select one or more cells from the cell library and to locally place each selected cell within the module layout so that each cell pin of the selected cells and each port of the module layout occupy a unique vertical routing track within the module layout.

In one embodiment, a method for programmatically placing cells into a module layout pattern of an integrated circuit layout is described. A total width of all cells to be placed in the module layout pattern is calculated. The total width is divided by a cell utilization width of the module layout pattern to determine a quotient. A number of rows of the module layout pattern is set equal to the quotient rounded up to a nearest integer value. Cells are placed into the rows of the module layout pattern in ascending cell levels from cell Level I to a maximum cell Level such that each cell pin of all the cells is positioned over a unique vertical track.

In another embodiment, a method for layout of a module within an integrated circuit layout is described. A cell is selected for placement within the module layout. An average horizontal coordinate of all placed cells and ports of the module layout to be connected to the selected cell is calculated. The selected cell is placed at the horizontal coordinate if that location is available for placement and cell pins of the selected cell would be positioned over unique vertical tracks relative to cell pins of other cells in the module layout and to ports of the module layout.

DETAILED DESCRIPTION OF ILLUSTRATIVE EMBODIMENTS

An embodiment of the present invention provides algorithms and procedures for complete layout of a given module within a given overall width W and with given input and output port locations. In general, algorithms and procedures are discussed below within the context of placement of a Redundant Random Access Memory (RRAM) configuration module. An RRAM is a memory module having spare rows and columns of memory cells. Though the discussion is generally directed to RRAM placement, the procedures and algorithms can also be applied to any module type for which the total number of cell pins is much smaller than the number of vertical (or, alternatively, horizontal) routing tracks.

In general, the cell placement algorithm uses modified standard cell libraries. Basically, each standard cell is routed so that each pin (input and output) of the cell occupies a different vertical routing track, and so that pins are brought from a first metal routing layer to a second, higher metal routing layer of the substrate.

Figure 1:
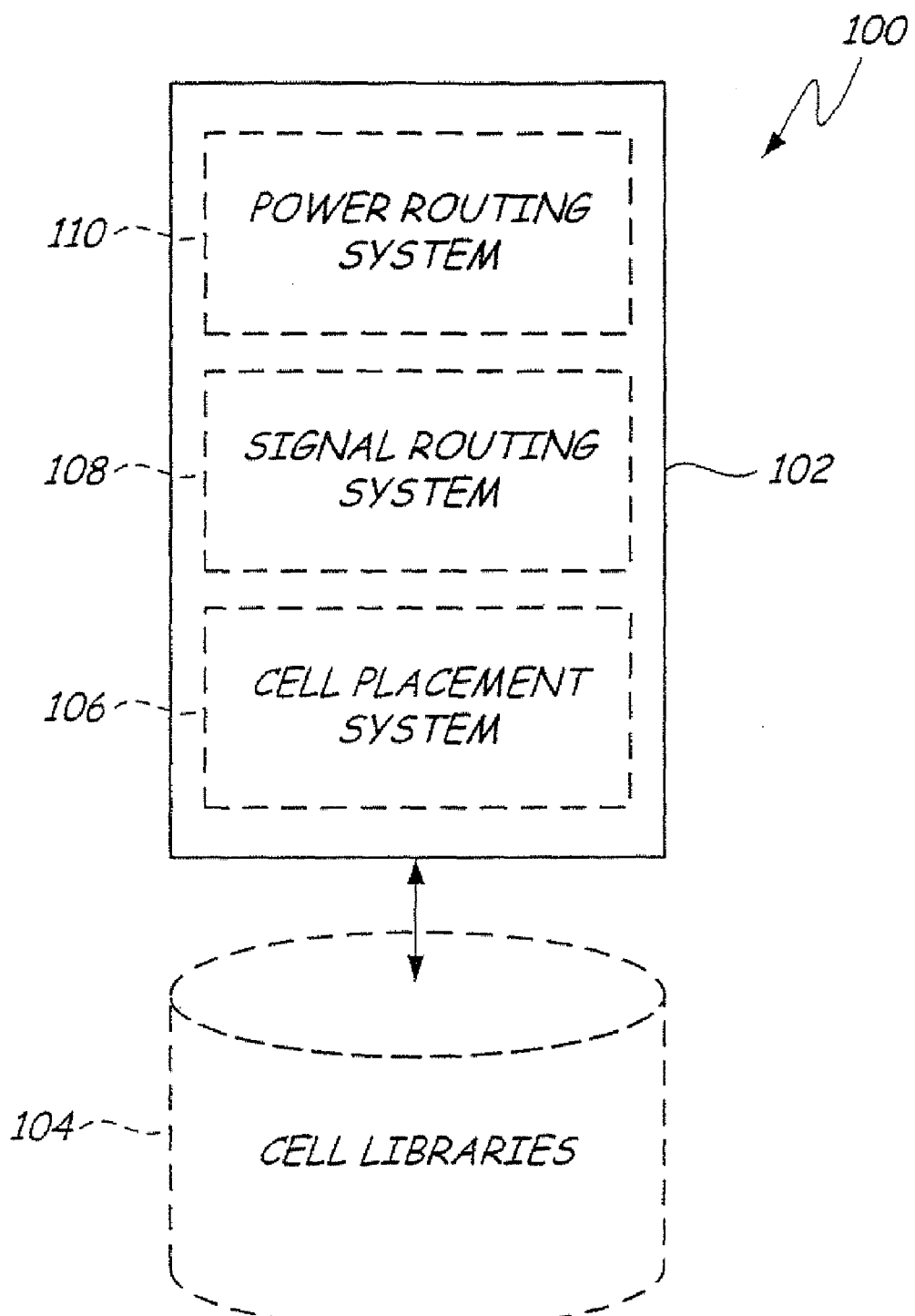
FIG. 1 is a simplified block diagram of a cell placement and net and power routing system according to an embodiment of the present invention.

FIG. 1 is a simplified block diagram of a system 100 for automated cell placement, signal routing and power routing of a module within an integrated circuit layout according to an embodiment of the present invention. Generally, the system 100 includes a computer system 102 coupled to one or more databases of cell libraries 104. The computer system 102 is generally adapted to implement the processes and methods of the present invention to produce a layout of a module, such as an RRAM configuration module and/or any module for which the total number of cell pins in the module is smaller than the number of vertical (or horizontal) routing tracks through the module. As used herein, the term "cell library" refers to a set of computer data files which contain some or all of the information needed to model, simulate, place and route cells in an integrated circuit layout, which can then be fabricated.

The computer system 102 generally includes a cell placement system 106 adapted to place cells into a layout of a module with a given width and given port locations. The cell placement system 106 is preferably adapted to place cells coupled to input or output ports of the module (level I cells) first, and to place cells coupled to Level I cells second, and so on. The cell placement system 106 generally optimizes cell placement such that cells that are logically connected are placed close to each other in order to minimize the overall wire length. Specifically, by utilizing a placement point corresponding to a horizontal location that is as close as possible to the average horizontal position of all cells connected to the selected cell, the placement system 106 typically minimizes wire lengths and optimizes cell placement for each selected cell. The placement process is discussed below in greater detail with respect to FIG. 3. In a preferred embodiment, the cell placement system 106 is adapted to place cells within a layout pattern of a module on an area of 80 percent or less of the overall width of the given module. Other sizes can also be used.

The computer system 102 generally also includes a signal routing system 108 adapted to calculate a horizontal span and left-most (minimum) horizontal pin location of each net in the module layout pattern. Preferably, the signal routing system 108 is adapted to sort a list of nets from minimum to maximum left-most horizontal pin location, and to route the nets in the sort order, beginning with the net having the left-most horizontal pin location. The signal routing system 108 is adapted to place each net on a first available horizontal track, beginning with the bottom of the module.

Finally, the computer system 102 includes a power routing system 110 adapted to map power and ground straps in the module layout pattern in an alternating configuration such that all vertical tracks not occupied by cell pins are utilized. Depending on the specific implementation of the module (for example if signal routing is particularly dense in the midsection of the module), the power routing system 110 may assign some routing tracks prior to cell placement.

The cell placement system 106, signal routing system 108 and power routing system 110 are shown in phantom to identify the various functional elements of the automated system 102. In particular, it should be understood that the various functions of systems 106 through 110 may be combined into a single software application or integrated into a single functional block within a larger software application, depending on the specific implementation. Additionally, for simplicity sake, elements are omitted from the block diagram, such as input/output devices, display devices, operating systems, hard disc drives, removable storage devices, network connections, and so on. It should be understood by a worker skilled in the art that the system 102 of the present invention may be implemented within a computer system having an operating system and containing software applications available to a computer operator which are unrelated to module creation and cell placement. Moreover, the computer system may be coupled to one or more networks, such as a local area network and a wide area network (such as the Internet).

The cell libraries 104 are indicated in phantom because the cell libraries 104 need not be stored in a single location. The cell libraries 104 may be stored in a memory within the system 102 or may be accessible via a network. Moreover, cell libraries 104 may be stored in different databases, and the system 102 may be adapted to retrieve selected cell libraries 104 from each of the one or more databases as needed over a network connection, for example.

Figure 2:
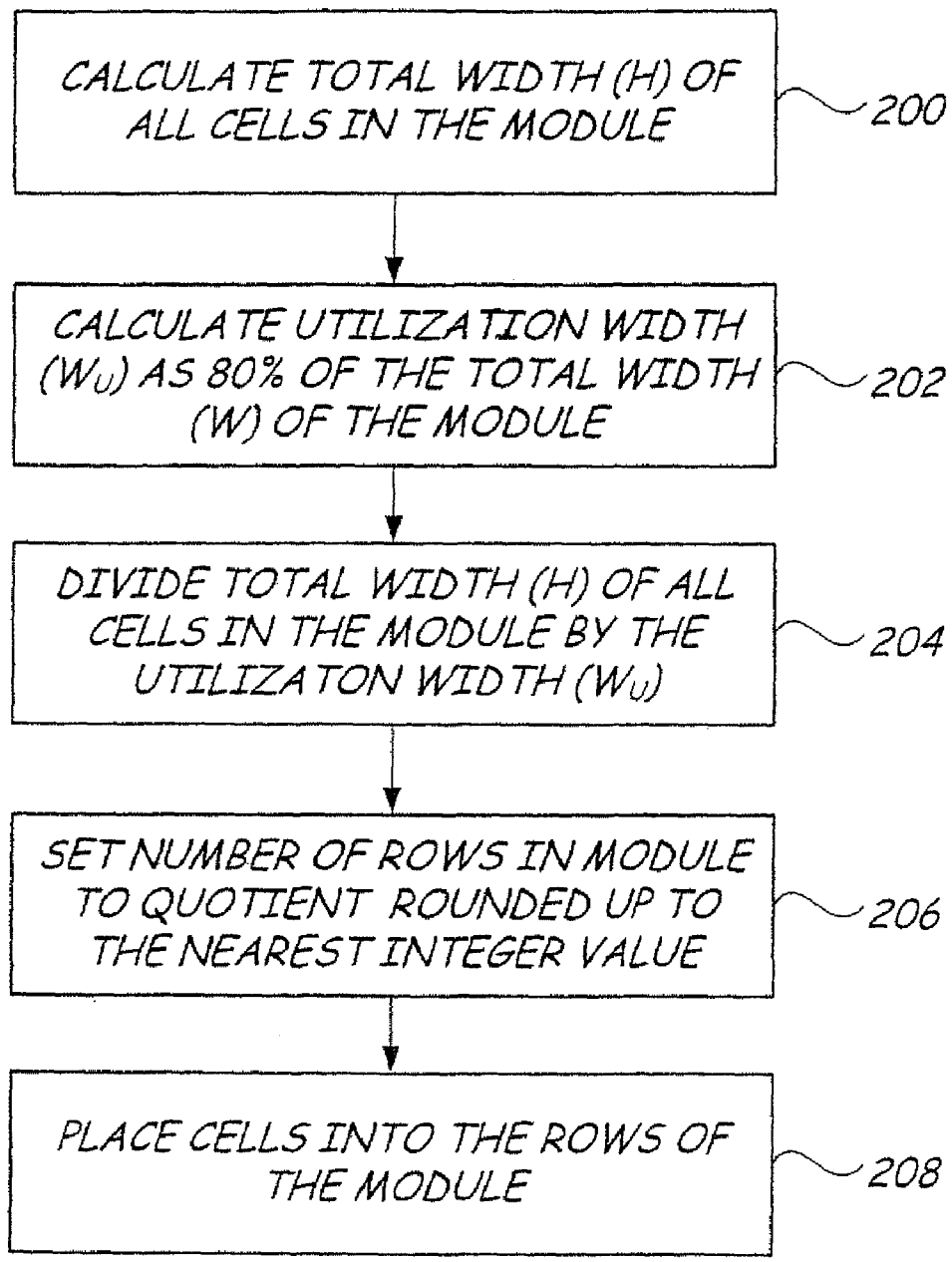
FIG. 2 is a simplified flow diagram of a process for calculating a number of rows in a module according to an embodiment of the present invention.

FIG. 2 illustrates a simplified flow diagram of a process for determining a number of rows for cell placement within a module of an integrated circuit layout pattern according to one embodiment of the present invention. At step 200, the cell placement algorithm first calculates the number of rows in the module layout pattern to ensure that the overall utilization of area in the pattern is not more than 80 percent, for example.

The number of rows is calculated by calculating the total width (H) of all cells to be placed in the module layout (step 200). Since the overall module width (W) is given, the module utilization width ($W_U$) is calculated as 80% of the overall module width (W) (step 202) within the module layout. The total width (H) of all cells in the module layout is then divided by the utilization width ($W_U$) (step 204) to produce a quotient that can be used to determine the number of necessary rows to achieve the desired utilization percentage. The quotient is rounded up to the nearest integer value to determine the number of rows (step 206). The cell placement algorithm then uses the number of rows to place cells into the module (step 208).

Though the flow diagram described above separates the row calculation process into individual steps, the calculation may be simplified to a single step. For example, the number of rows (R) can be calculated using the following equation:

$$R = \mathrm{ceil}(H/(0.8W))$$

where "ceil" is a "ceiling" or upward-rounding function that rounds the quotient within the parenthesis up to the nearest integer value, R represents an integer number of rows, H represents the total width of all cells in the module, and W is the given module width. Depending on the specific RRAM parameters, there are typically two or three rows for the configuration module layout pattern.

As with many other placement algorithms, the goal of the placement process is to minimize the overall wire length within the layout pattern, and ultimately within the fabricated IC. Specifically, the goal is to place cells, which are logically connected, close to one another in the layout pattern. Since module port locations are given, one embodiment of the present invention begins with cells that are directly connected to ports (level I cells). In the next iteration, level II cells are placed. Level II cells are those cells that are connected to level I cells, but which are not directly connected to ports, and so on. In the RRAM configuration module, all cells typically belong to levels I or II.

Figure 3:
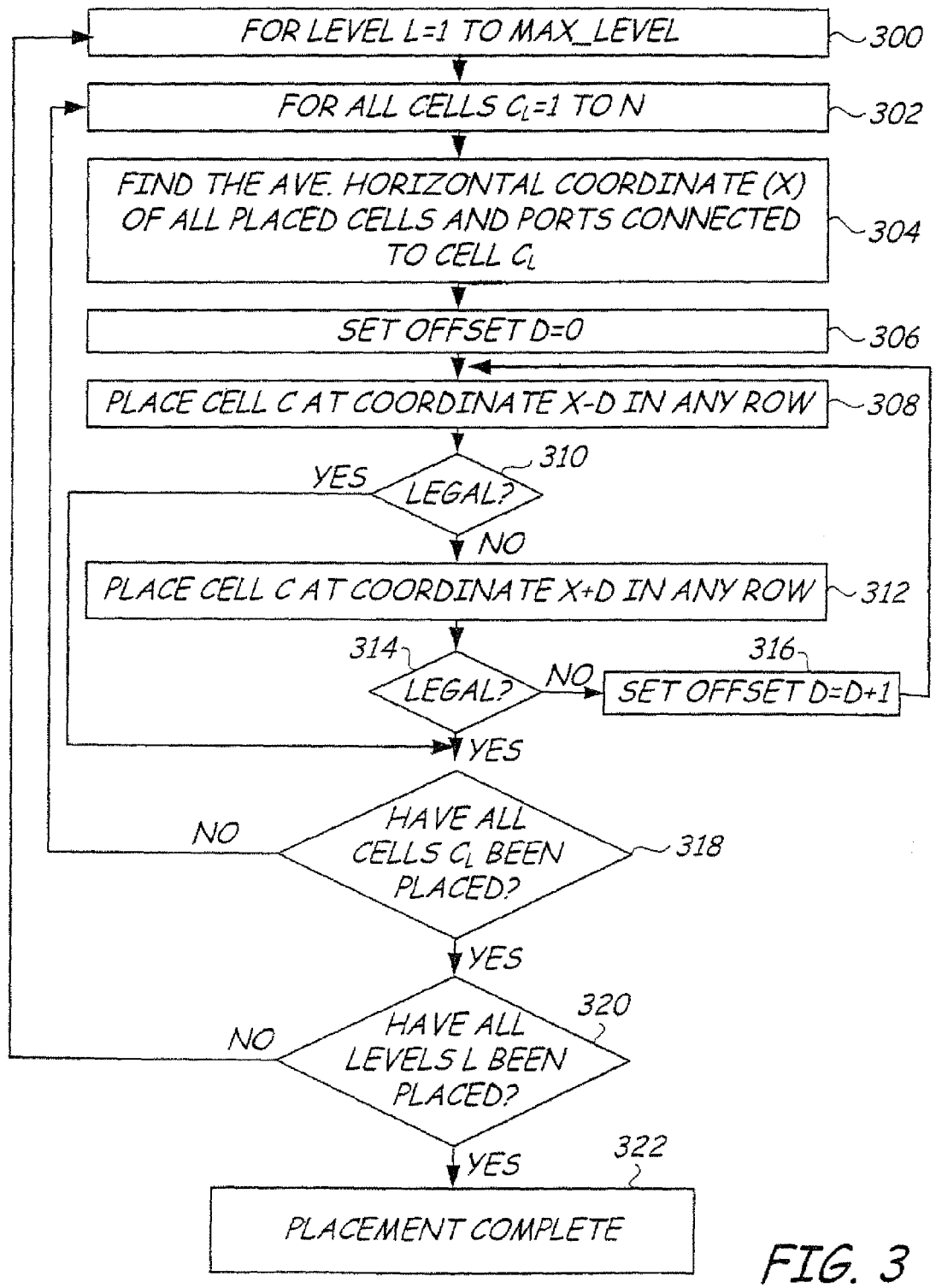
FIG. 3 is a simplified flow diagram of a process for placing the module according to an embodiment of the present invention.

FIG. 3 illustrates a simplified flow diagram of a process for placing cells within a given module layout pattern. The process begins with level I cells, places all level I cells, then places all level II cells, and so on until all cells at the maximum cell level are placed. For ease of discussion, the placement algorithm is presented in FIG. 3 as a pseudo-code for the purpose of illustrating the iterative placement steps. A cell level "FOR" loop (step 300) is shown, and within the cell level "FOR" loop, a cell "FOR" loop (step 302) is described. For clarity purposes, the discussion below traces placement of a cell at a cell level.

Cell level 1 is selected (step 300). Cell 1 at cell level 1 is selected (step 302). The average horizontal coordinate (X) of all placed cells and ports connected to cell 1 is calculated (step 304). Because of the order of cell placement, there always exists at least one already placed cell or at least one port is connected directly to the cell to be placed (meaning the cell $C_L$ is a level 1 cell).

For the selected cell ($C_L$), a horizontal offset (D) is initialized to zero (step 306). The system attempts to place the selected cell ($C_L$) at the average horizontal coordinate (X) minus the offset (D) (step 308). If the cell placement is illegal (step 310) at that location (for example if placement of the cell $C_L$ would overlap another cell or if cell pins and top level ports would occupy the same vertical tracks), the system attempts to place the selected cell ($C_L$) at the average horizontal coordinate (S) plus the offset (D) (step 312). If the placement is not legal (step 314), the offset value (D) is incremented, and placement steps 308-312 are repeated.

If placement is legal at either steps 310 or 314, the system checks to make sure that all cells at the selected level have been placed (step 318). If not, the system selects the next cell and repeats steps 304-316 until all of the cells for the selected level have been placed. The system then checks if all cell levels have been placed (step 320). If not, the next cell level (L) is selected and steps 302-318 are repeated until all cell levels have been placed. Once all cell levels have been placed (step 320), cell placement within the module is complete (step 322).

Phrased another way, during the placement process, the system attempts to place cell C at the horizontal coordinate (X) in any of the rows within the layout pattern. The system checks to make sure that the placement is legal (meaning that the placed cell does not overlap with other cells) and that all cell pins and all top-level ports occupy different vertical tracks. This latter condition makes it possible for the signal routing procedure to be performed in an efficient manner. If the selected cell C cannot be placed at the coordinate (X), a neighboring coordinate is tried (either to the left or right of the coordinate position). The search for a legal placement location is continued in this manner until a legal place is found for cell C.

By positioning selected cells at a location that is as close as possible to an average horizontal position of all placed cells and ports which are connected to the selected cell, the placement algorithm ensures that the cell placement will be optimized. Specifically, the average horizontal position generally ensures a minimization of wire lengths connecting the selected cell to the other cells and ports to which it is connected.

In general, the placement algorithm largely ignores the vertical coordinate axis. Specifically, because of the very small number of cell rows (usually two or three), the vertical coordinate has negligible variation and can be ignored.

Figure 4:
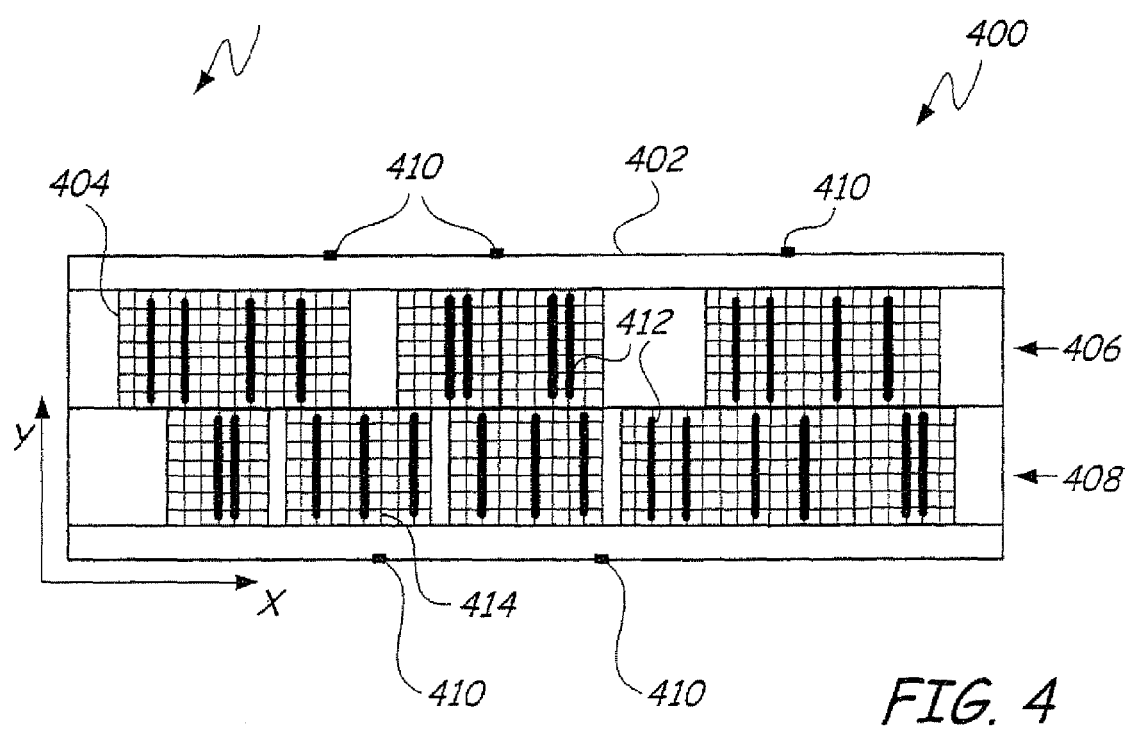
FIG. 4 is a simplified top view of an IC width placed size according to an embodiment of the present invention.

FIG. 4 illustrates an example a module 400 according to an embodiment of the present invention. The module 400 includes a layout pattern 402 with cells 404 placed in rows 406 and 408. Top level ports 410 are provided on opposing sides of the module. Typically, ports 410 are input and output ports through which the module layout pattern 402 can be mapped within the IC layout pattern to other module layout patterns or cells.

Cell pins 412 are provided within individual cells 404 and may be electrically coupled to other cell pins 412 and/or to ports 410, depending on the specific routing implementation of the module 400. In one embodiment, cells 404 are placed in rows 406 and 408 such that each cell pin 412 and all top level ports 410 occupy different vertical routing tracks 414.

In general, the signal routing scheme uses second, third and fourth routing layers, commonly denoted as $M_2$, $M_3$ and $M_4$. Routing layers $M_2$ and $M_4$ contain vertical wires (for example), and routing layer $M_3$ contains horizontal wires (for example). Top-level ports 410 are placed on the $M_4$ routing layer.

The cell pins 412 are placed on routing layer $M_2$. Each port 410 can be connected to one or more of the cell pins 412, and each cell pin 412 can be connected to one or more of the other cell pins by vertical wires on their respective layers to a shared horizontal "main" wire on the third routing layer $M_3$, for example. In other words, each net in a module is routed using a "comb" structure. Each net has one "main" horizontal wire disposed on the third routing layer $M_3$, and each cell pin 412 and port 410 that is connected to that net has a vertical wire on the second or fourth routing layer that is connected to the "main" horizontal wire.

Figure 5:
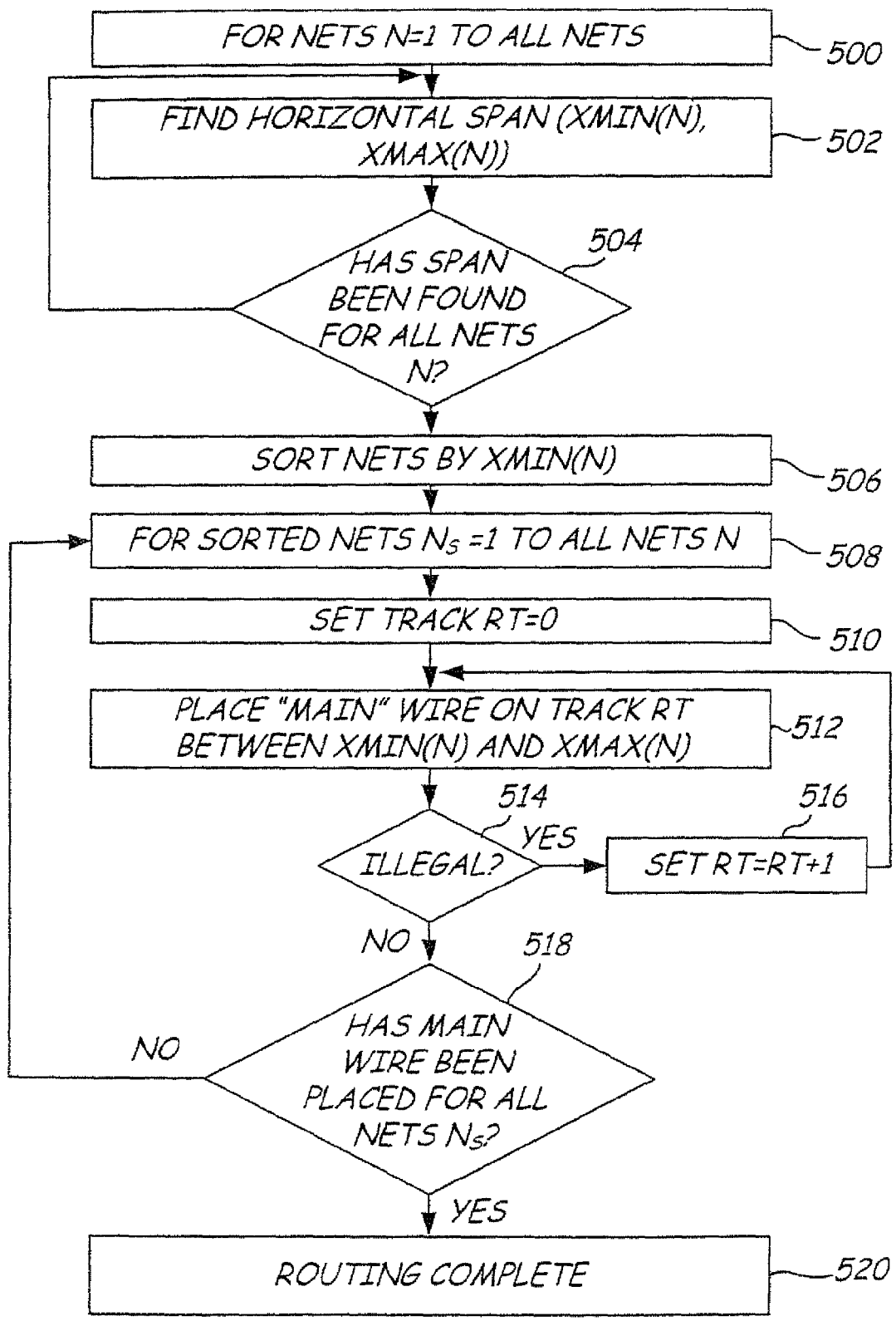
FIG. 5 is a simplified flow diagram of a routing algorithm for insuring that the main wires from different nets do not intersect each other according to an embodiment of the present invention.

FIG. 5 is a simplified flow diagram of a process for routing nets within a module layout pattern, such as for an RRAM module according to an embodiment of the present invention. In general, for each net, the horizontal span is calculated, and each net is inserted in increasing order beginning with the left-most (or alternatively right-most) pin coordinate. Nets are routed in this order. Since there is no conflict between vertical wires, it is only necessary to make sure that the "main" horizontal wires from different, unconnected nets do not intersect each other. This is achieved using a simply greedy algorithm, for example.

For each net, the system attempts to place the "main" horizontal wire within the layout on each horizontal track, starting with the bottom one (or alternatively the top one), until an available space is found. If the number of horizontal tracks within a row is not sufficient for routing, the module is expanded on the top (or bottom) to gain more routing tracks.

Referring now to FIG. 5, the total number of nets within the layout pattern is identified. Using pseudo-code for explanatory purposes, a "FOR" loop requiring placement of all nets is entered (step 500). For all nets (N), the horizontal span for each net are found (step 502) by locating the minimum horizontal coordinate xmin(N) for net N and the maximum coordinate xmax(N) for net N. The xmin(N) and xmax(N) coordinates correspond to the left-most and right-most locations of any cell pin or module pin that is connected to net N.

If all minimum and maximum spans are not found (step 504), the system repeats step 502 until all horizontal spans have been evaluated.

The nets are then sorted according to the minimum horizontal spans (step 506). A second "FOR" loop is used to evaluate the sorted list of minimum horizontal spans (step 508). Routing track (RT) is set to 0 (step 510). The horizontal wire is then placed on the routing track (RT) extending between horizontal coordinate Xmin(N) and Xmax(N) for the selected net (step 512). If the wire placement is illegal (such as if it overlaps an already placed wire) or otherwise cannot be placed in that location (step 514), the routing track (RT) is incremented (step 516), and placement is again attempted at the new routing track location (step 512 is repeated).

If the wire is successfully placed (step 514), the system checks to see if the main horizontal wire has been placed for each of the sorted nets (step 518). If not, the next net in the sorted list of nets is selected, and steps 510 through 518 are repeated until all nets of the sorted list of nets have been placed. Once all of the nets in assorted order have been successfully placed (step 518), the routing is complete (step 520).

Figure 6:
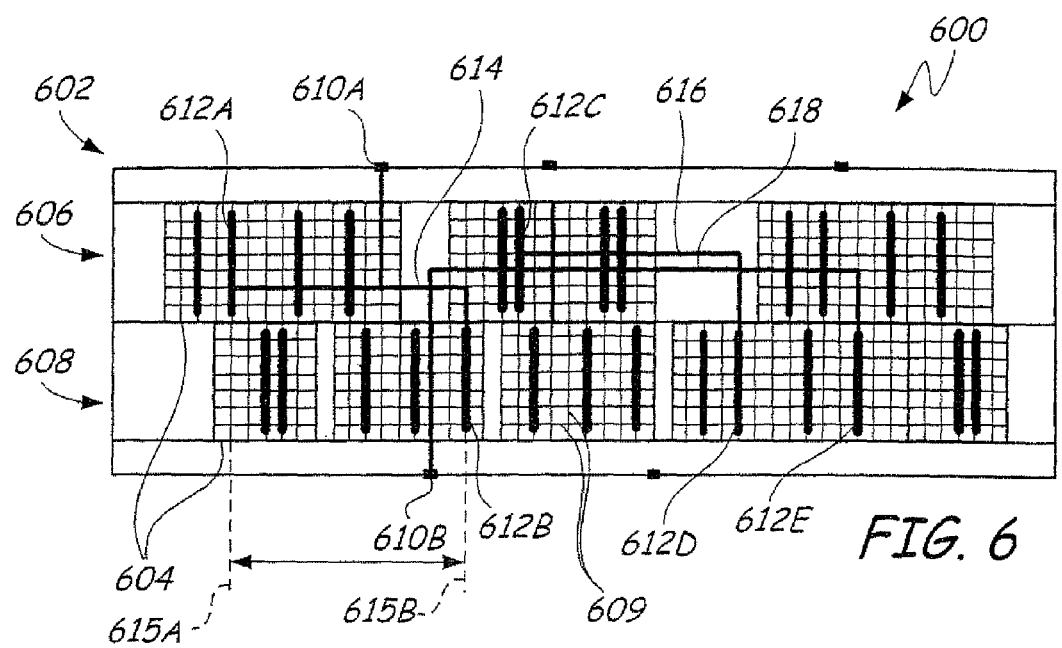
FIG. 6 is a simplified top view of an IC with two rows of placed cells showing three examples of routing according to an embodiment of the present invention.

FIG. 6 illustrates placed cells in a module 600 with examples of three routed nets according to an embodiment of the present invention. The module 600 includes layout pattern 602 with cells 604 placed in rows 606 and 608. Grid 609 represents the vertical and horizontal routing tracks along the various layers. Top level ports 610 are provided on opposing sides of the module. Typically, ports 610 are input and output ports through which the module 600 is mapped to other module or cell layout patterns in an IC, and through which signals can be delivered to cells within module 600.

Each cell 604 has one or more cell pins 612, which can be electrically coupled to other cell pins 612 and/or to ports 610, depending on the specific routing implementation of the layout pattern 602. Each cell pin 612 and all top-level ports 610 occupy different vertical routing tracks.

Net 614 connects one top-level port 610A and two cell pins 612A and 612B, which are in rows 606 and 608, respectively. Net 614 has a main horizontal wire, which spans from x-coordinate 615A to a maximum x-coordinate 615B. Pins 612A and 612B are connected to the horizontal wire along the vertical routing tracks of those pins and corresponding vias to the horizontal routing tracks. As described with respect to FIG. 5, each net is routed in order of the left-most x-coordinate. Net 616 connects cell pin 612C in row 606 to cell pin 612D in row 608. Net 618 connects port 610B to cell pin 612E in row 608.

Figure 7:
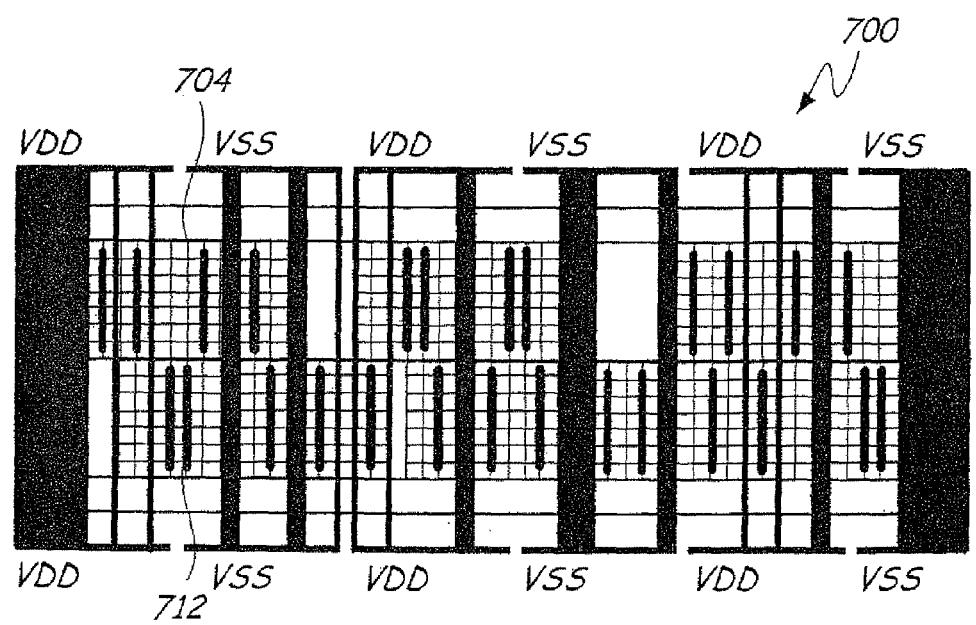
FIG. 7 is a simplified power routing diagram for the module of FIG. 6 according to an embodiment of the present invention.

FIG. 7 illustrates a simplified diagram of a power routing scheme for delivering power within a module layout pattern 700 according to an embodiment of the present invention. Generally, power is routed in module layout pattern 700 using all vertical second routing layer ($M_2$) tracks that are not occupied by cell pins 712. The power mesh of module 700 includes alternating power and ground straps VDD and VSS. Since the signal routing process uses the second layer ($M_2$) tracks only to connect cell pins 712 on vertical tracks where cell pins 712 are already placed, the signal routing scheme does not block any additional vertical second layer ($M_2$) tracks.

In a typical application, the number of power and ground straps is much greater than that shown in the examples herein, particularly at the ends of the module 700. Signal routing is normally dense in the middle of the module 700, so in some cases, it may be necessary to assign some routing tracks for power and ground straps at the outset, before cell placement.

The placement and routing process described in the above-examples provides a number of advantages over prior art placement and routing algorithms. In particular, by placing cells as near as possible to an average horizontal position of all cells coupled to the pin to be placed, the average wire length is minimized for each placed cell in the layout. Moreover, by placing cells so that each cell pin is mapped to a unique vertical routing track, signal routing between cells is simplified. By placing cells such that all cell pins occupy unique vertical tracks, signal routing is reduced to locating an available horizontal track for connecting cell pins and ports. This process also simplifies cell-placement and power routing.

Although the present invention has been described with reference to preferred embodiments, workers skilled in the art will recognize that changes may be made in form and detail without departing from the spirit and scope of the invention. For example, the terms "left" and "right", "top" and "bottom" and "horizontal" and "vertical" are interchangeable.

What is claimed is:

1. A method comprising:
   selecting a plurality of cells from a cell library for placement within a module layout pattern of an integrated circuit layout having vertical and horizontal routing tracks;
   using a computer to place each of the selected cells in a different row than at least one other cell placed in the layout pattern and at a horizontal position within the module layout pattern if that position is available for placement and all cell pins of the selected cells would be positioned over unique vertical routing tracks in the module layout pattern relative to cell pins of all other cells in the module layout pattern and to ports of the module layout pattern; and
   outputting data representing placement of the selected cells within the module layout pattern.

2. The method of claim 1 and further comprising:
   calculating a total width of all cells to be placed in the module layout pattern;
   dividing the total width by a cell utilization width of the module layout pattern to determine a quotient;
   setting a number of rows of the module layout pattern equal to the quotient rounded up to a nearest integer value; and
   wherein the step of placing comprises placing cells into the rows of the module layout pattern in ascending cell levels from cell Level I to a maximum cell Level such that all cell pins of all the cells are positioned over unique vertical routing tracks.

3. The method of claim 2 wherein the step of placing is repeated until all cells are placed without overlapping any placed cell within the module layout pattern.

4. The method of claim 2 wherein the step of placing comprises:
   calculating an average horizontal position of all placed cells connected to the selected cell; and
   positioning the selected cell as close as possible to the average horizontal position without overlapping any placed cell and such that any cell pins of the selected cell are oriented over unique vertical routing tracks relative to cell pins of already placed cells and relative to ports of the module layout pattern.

5. The method of claim 4 wherein the step of positioning comprises:
   positioning the selected cell at the horizontal position in the module layout pattern corresponding to the average horizontal position of all cells connected to the selected cell;
   adjusting the horizontal position by an offset distance if the selected cell overlaps a placed cell at the horizontal position; and
   positioning the selected cell at the offset horizontal position and repeating the adjusting step until the selected cell is placed.

6. The method of claim 2 further comprising:
   routing horizontal signal wires between cell pins and between ports of the module layout pattern and cell pins on a first available horizontal routing track beginning from a bottom horizontal routing track of the module layout pattern.

7. The method of claim 6 wherein the step of routing comprises:
locating a minimum horizontal coordinate (xmin(N)) and a maximum horizontal coordinate (xmax(N)) for each wire in a net (N), the minimum and maximum horizontal coordinates corresponding to left-most and right-most locations of any cell pin or port of the module layout pattern that is connected to the net; and
routing each horizontal signal wire from its minimum horizontal coordinate (xmin(N)) to its maximum horizontal coordinate (xmax(N)).

8. The method of claim 2 further comprising:
routing power wires on all unused vertical routing tracks of the module layout pattern.

9. The method of claim 1 wherein, for each of the plurality of selected cells, if the selected cell would overlap any other placed cell at the horizontal position, the method further comprising:
adjusting the horizontal position by an offset distance; and
repeating the placing step and the adjusting step until the selected cell is placed without overlapping any other placed cells in the module layout pattern.

10. The method of claim 1 wherein the step of selecting comprises first selecting cells coupled directly to a port of the module layout pattern, called level I cells, and then selecting cells coupled to Level I cells and not coupled directly to a port of the module layout pattern, called level II cells, the method further comprising:
repeating the steps of selecting, calculating and placing until all cells of a selected cell level are placed;
selecting a next cell level; and
repeating the steps of selecting, calculating and placing until all cells of the next cell level are placed within the module layout pattern.

11. The method of claim 1 wherein:
routing a signal wire on a first available horizontal routing track of the module layout pattern beginning from a bottom horizontal routing track of a cell row within the module layout pattern.

12. The method of claim 11 wherein if there are insufficient numbers of horizontal routing tracks within the cell row for routing a selected signal wire, the method further comprising:
expanding the module layout pattern on a top of the module layout pattern to acquire additional resources for signal routing.

13. The method of claim 1 further comprising:
routing power wires on available vertical routing tracks within the module layout pattern, the available vertical routing tracks representing tracks that are unused by the ports or placed cell pins within the module layout pattern.

14. The method of claim 1 and further comprising:
calculating an average horizontal position of all placed cells and ports of the module layout pattern to be connected to the selected cell.

* * * * *